United States Patent
Dutta (10) Patent No.: US 10,707,352 B2
(45) Date of Patent: Jul. 7, 2020

(54) TRANSISTOR WITH LIGHTLY DOPED DRAIN (LDD) COMPENSATION IMPLANT

(71) Applicant: QUALCOMM Incorporated, San Diego, CA (US)

(72) Inventor: Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/149,505

(22) Filed: Oct. 2, 2018

(65) Prior Publication Data

US 2020/0105941 A1   Apr. 2, 2020

(51) Int. Cl.
*H01L 29/786* (2006.01)
*H01L 29/66* (2006.01)

(52) U.S. Cl.
CPC .... *H01L 29/78609* (2013.01); *H01L 29/7869* (2013.01); *H01L 29/78621* (2013.01); *H01L 29/6675* (2013.01)

(58) Field of Classification Search
CPC ......... H01L 29/78609; H01L 29/78621; H01L 29/7869; H01L 29/6675
See application file for complete search history.

(56) References Cited

U.S. PATENT DOCUMENTS

| | | | | |
|---|---|---|---|---|
| 6,486,513 B1* | 11/2002 | Matsumoto | | H01L 21/84 257/347 |
| 6,727,149 B1* | 4/2004 | Krishnan | | H01L 29/66772 257/E21.345 |
| 2002/0079544 A1* | 6/2002 | Shino | | H01L 27/1203 257/388 |
| 2003/0162336 A1* | 8/2003 | Wei | | H01L 21/26506 438/166 |
| 2004/0079997 A1* | 4/2004 | Miura | | H01L 29/458 257/347 |
| 2006/0051922 A1* | 3/2006 | Huang | | H01L 29/6659 438/282 |
| 2007/0228482 A1* | 10/2007 | Wei | | H01L 21/84 257/369 |
| 2007/0252204 A1* | 11/2007 | Wei | | H01L 29/78684 257/347 |
| 2008/0217705 A1* | 9/2008 | Hall | | H01L 21/76283 257/401 |
| 2009/0294860 A1* | 12/2009 | Mowry | | H01L 21/823807 257/368 |
| 2014/0191316 A1* | 7/2014 | Zhao | | H01L 29/66507 257/336 |

* cited by examiner

*Primary Examiner* — Nathan W Ha
(74) *Attorney, Agent, or Firm* — Patterson & Sheridan, L.L.P.

(57) ABSTRACT

Certain aspects of the present disclosure generally relate to a transistor having an implant region for reducing a net doping concentration below an edge of a gate region of the transistor. One example transistor generally includes a first semiconductor region, a second semiconductor region, and a third semiconductor region, the first semiconductor region being between and having a different doping type than the second semiconductor region and the third semiconductor region. In certain aspects, the transistor also includes a gate dielectric layer disposed above the first semiconductor region, a non-insulative region disposed above the gate dielectric layer, and an implant region disposed above the second semiconductor region, the implant region having a different doping type than the second semiconductor region.

19 Claims, 5 Drawing Sheets

TRANSISTOR WITH LIGHTLY DOPED DRAIN (LDD) COMPENSATION IMPLANT

TECHNICAL FIELD

Certain aspects of the present disclosure generally relate to electronic components and, more particularly, to transistors.

BACKGROUND

A transistor is a semiconductor device used to perform various operations. For example, a transistor may be used as a solid-state switch or used to amplify signals. There are several types of transistors, one of the most common types being a metal-oxide-semiconductor field-effect transistor (MOSFET). A MOSFET may be implemented as a p-type transistor also referred to as a p-type metal-oxide-semiconductor (PMOS) transistor, or an n-type transistor also referred to as an n-type metal-oxide-semiconductor (NMOS) transistor, both of which have a similar structure but are implemented with semiconductor regions having opposite doping types.

SUMMARY

Certain aspects of the present disclosure generally relate to a transistor having an implant region for reducing net doping concentration below an edge of a gate region of the transistor.

Certain aspects of the present disclosure provide a transistor. The transistor generally includes a first semiconductor region; a second semiconductor region; a third semiconductor region, the first semiconductor region being between and having a different doping type than the second semiconductor region and the third semiconductor region; a gate dielectric layer disposed above the first semiconductor region; a non-insulative region disposed above the gate dielectric layer; and a first implant region above the second semiconductor region, the first implant region having a different doping type than the second semiconductor region.

Certain aspects of the present disclosure provide a method for fabricating a transistor. The method generally includes forming a first semiconductor region; forming a first implant region; forming a second semiconductor region, wherein the first implant region is formed above the second semiconductor region, the first implant region having a different doping type than the second semiconductor region; forming a third semiconductor region, the first semiconductor region being formed between and having a different doping type than the second semiconductor region and the third semiconductor region; and forming a gate dielectric layer above the first semiconductor region; and forming a non-insulative region above the gate dielectric layer.

Certain aspects of the present disclosure provide a transistor. The transistor generally includes a first semiconductor region; a second semiconductor region; a third semiconductor region, the first semiconductor region being between and having a different doping type than the second semiconductor region and the third semiconductor region; a gate dielectric layer disposed above the first semiconductor region; a non-insulative region disposed above the gate dielectric layer; and means for reducing a net doping concentration of a portion of the second semiconductor region, the portion of the second semiconductor region being below the gate dielectric layer.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Transistor

As the drain-to-source voltage of a transistor increases, electrons are accelerated in the channel to high velocities, which may cause degradation of the transistor or instability. This phenomenon is referred to as the hot carrier effect, which may have an adverse impact on the transistor. For example, for a p-type metal-oxide-semiconductor (PMOS), the electrons may go through the gate oxide of the transistor, changing the threshold voltage of the PMOS transistor. To reduce the hot carrier effect, an implant lightly doped region (referred to as a lightly doped drain (LDD)) may be implemented between the drain region and the channel of the transistor. To reduce process complications, an LDD region may be implemented adjacent to both the source and the drain of the transistor.

Certain aspects of the present disclosure are generally directed to a transistor implemented to reduce gate-induced drain leakage (GIDL) current (or body leakage). For example, certain aspects provide a shallow LDD compensation implant which may be formed prior to the LDD implant and through the same LDD mask opening during fabrication of the transistor.

The shallow LDD compensation implant allows for the reduction of band-to-band tunneling (BTBT), and thereby increases the drain breakdown voltage of the transistor.

BTBT generally occurs in the deep depletion region of the LDD under the gate region. The high dopant concentration in the gate-drain overlap region of a transistor in conventional complementary metal-oxide semiconductor (CMOS) devices is caused primarily by the heavy source-drain implant spanning to a region below the spacer of the gate region, and to a smaller extent, caused by the LDD implant of the transistor.

The high concentration in the gate-drain overlap region generates a vertical electric field in the gate-drain overlap region, causing increased amounts of GIDL, reducing the high voltage capability of CMOS devices, and increasing standby leakage current (e.g., $I_{CCS}$) of the transistor. In certain aspects of the present disclosure, a shallow LDD compensation implant region (also referred to herein as an "implant region") may be implemented to compensate for (or at least reduce) the high concentration of source-drain implant under the gate oxide edge overlapping the drain portion of the transistor.

The key junction engineering of the techniques provided herein achieves reduction of net dopant concentration in the gate-drain overlap region, while simultaneously maintaining a graded drain-well junction profile. The graded drain-well junction profile may be attained through an angled LDD implant, whereas the reduction of net dopant concentration may be achieved through an oppositely doped angled LDD compensation implant shallower than the LDD, so as not to impact the LDD-well junction curvature.

The goal of the compensation implant is to reduce the source and drain induced doping under the gate edge to reduce BTBT. A further improvement is attained by decreasing the source/drain implant energy and dose, and thus reducing the straggle and side diffusion of the heavily doped source/drain atoms across the spacer width.

Figure 1:
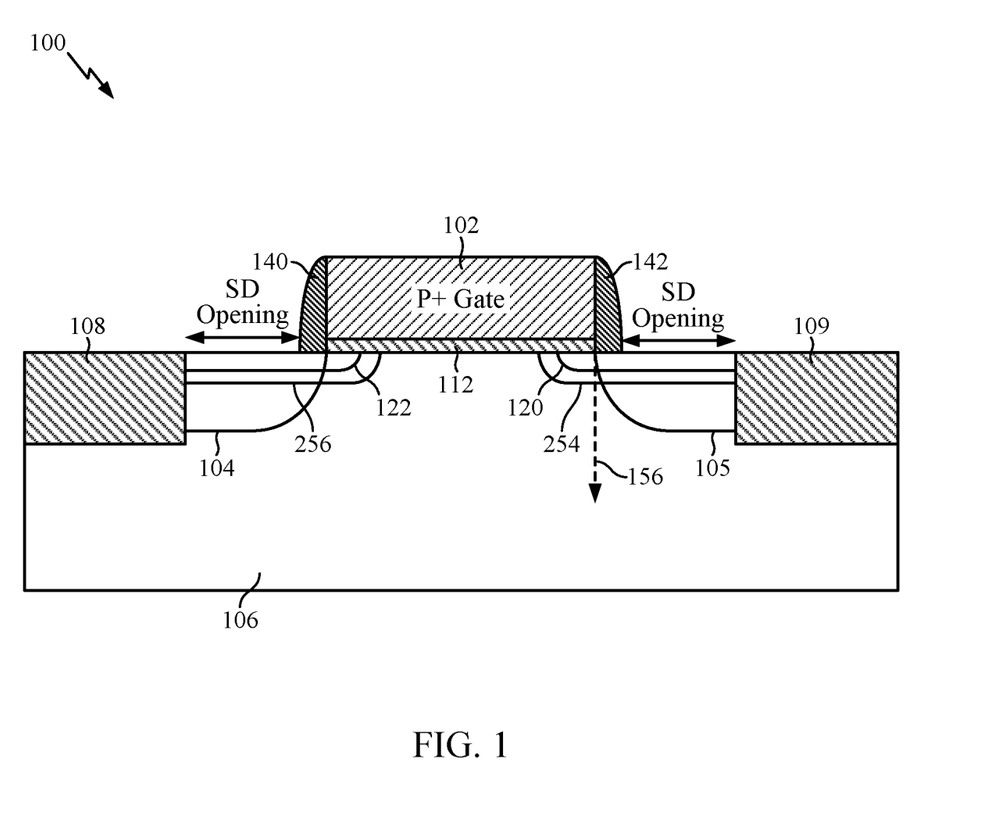
FIG. 1 illustrates a transistor having shallow implant regions, in accordance with certain aspects of the present disclosure.

FIG. 1 illustrates a transistor 100 having implant regions 120, 122 (e.g., shallow LDD compensation implant regions), in accordance with certain aspects of the present disclosure. The transistor 100 includes a semiconductor region 106 (e.g., an n-well region), a semiconductor region 104 (e.g., a P+ doped semiconductor region), a semiconductor region 105 (e.g., a P+ doped semiconductor region), a gate dielectric layer 112, and a non-insulative region 102 (e.g., a P+ doped semiconductor region), as illustrated. As used herein, a "non-insulative region" generally refers to a region that may be electrically conductive or semiconductive. The gate region, including the gate dielectric layer 112 and the non-insulative region 102, may be located between spacer regions 140, 142. While the spacer regions 140, 142 are illustrated as separate regions in the cross section of transistor 100 shown in FIG. 1, the spacer regions 140, 142 may be parts of the same spacer surrounding the gate region of the transistor 100. In certain aspects, the source and drain regions (e.g., semiconductor regions 104, 105) may be between shallow trench isolation (STI) regions 108, 109 to electrically isolate the transistor 100 from one or more other components that may be fabricated adjacent to the transistor 100.

In certain aspects of the present disclosure, an implant region 120 may be disposed above the semiconductor region 105. In certain aspects, an implant region 122 may be disposed above the semiconductor region 104. Each of the implant regions 120, 122 may have a different doping type than the semiconductor regions 104, 105 in order to reduce the net doping concentration under the gate oxide edge (e.g., below the spacer regions 140, 142). For example, because the transistor 100 is a p-type metal-oxide-semiconductor (PMOS) transistor, the semiconductor regions 104, 105 are p-type semiconductor regions. In this case, the implant regions 120, 122 may be n-type semiconductor implant regions (e.g., doped with arsenic (As)). The implant regions 120, 122 may be entirely disposed above the semiconductor regions 105, 104, respectively, and serve the purpose of drain voltage enhancement by reducing the net drain doping under the gate edge. For example, the implant region 122 may span from the STI region 108 to below the spacer region 140, and the implant region 120 may span from the STI region 109 to below the spacer region 142, as illustrated. In certain aspects, the implant regions 120, 122 may be implemented above only a portion of respective semiconductor regions 105, 104. For example, the implant region 120 may be implemented only between the semiconductor region 105 and the spacer region 142.

While the examples provided herein are described with respect to a PMOS transistor to facilitate understanding, aspects of the present disclosure may also be applied to an NMOS transistor. For example, for an NMOS transistor, the semiconductor region 106 may be a p-type semiconductor, and the source and drain regions (semiconductor regions 104, 105) may be n-type semiconductor regions. Thus, the implant regions 120, 122 may be implemented as p-type semiconductor regions (e.g., doped with boron (B) or difluoroboron (BF2)) to reduce the net doping concentration below the gate edge as previously described.

Figure 2A:
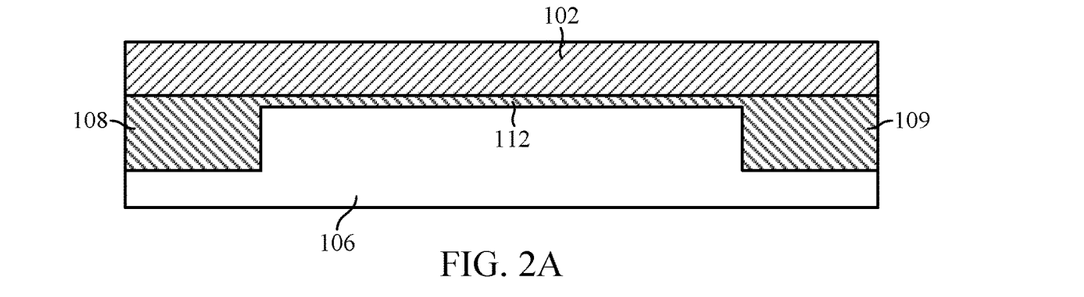
FIGS. 2A-2G illustrate example operations for fabricating a transistor, in accordance with certain aspects of the present disclosure.

FIGS. 2A-2G illustrate example operations for fabricating a transistor with one or more shallow LDD compensation implant regions, in accordance with certain aspects of the present disclosure. As illustrated in FIG. 2A, a gate oxide (e.g., corresponding to the gate dielectric layer 112) may be disposed on a semiconductor region 106 (e.g., n-well region). The STI regions 108 and 109 may also be formed to isolate the transistor from other components, as previously described.

Figure 2B:
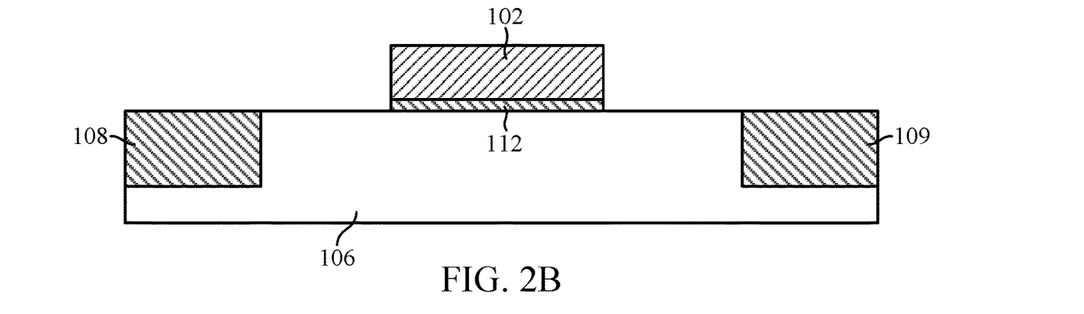
Figure 2C:
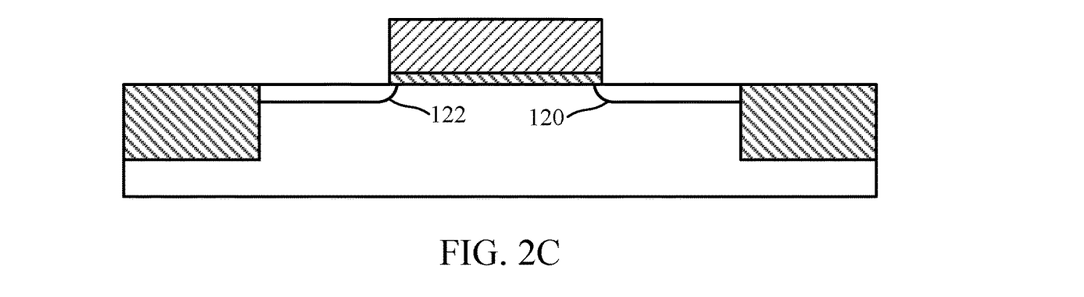
Figure 2D:
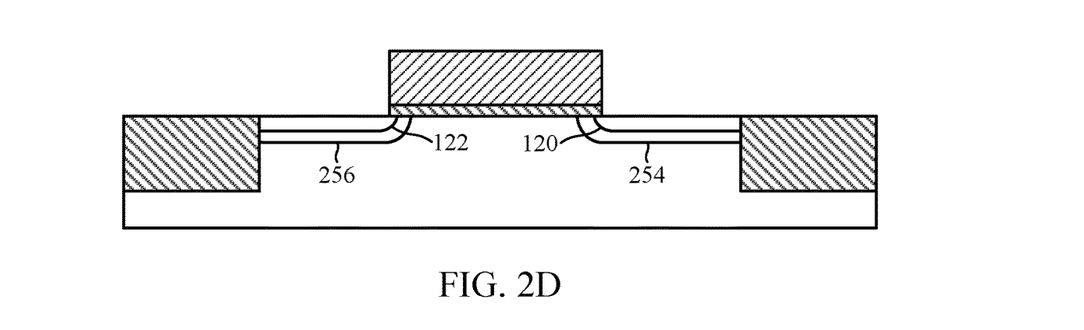
Figure 2E:
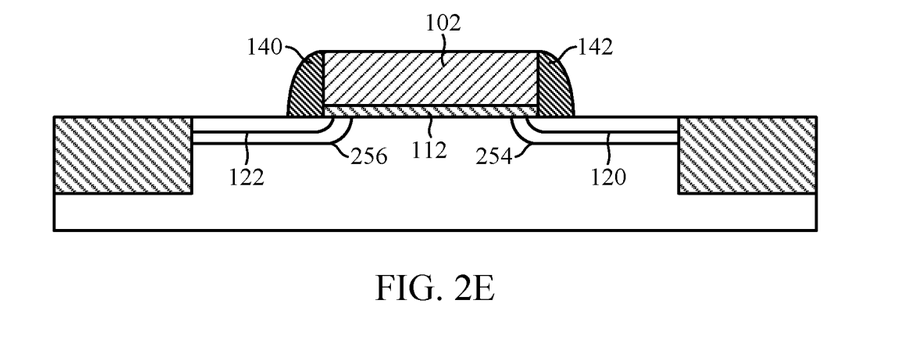
Figure 2F:
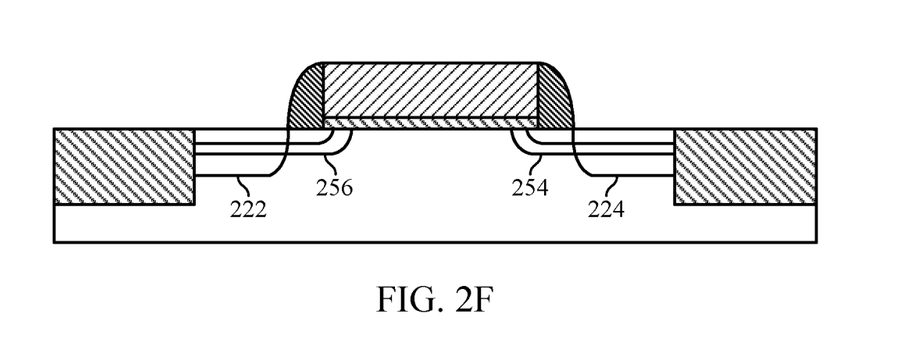
Figure 2G:
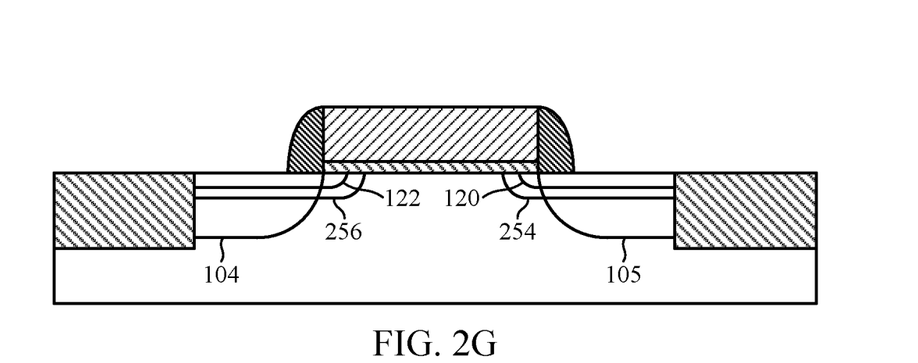

Polysilicon (e.g., corresponding to the non-insulative region 102) may be deposited on the gate oxide and pattern etched to form the gate region, as illustrated in FIG. 2B. As illustrated in FIG. 2C, the implant regions 120, 122 are then formed, prior to the LDD implant regions 254, 256 (e.g., boron LDD implant regions) being formed, as illustrated in FIG. 2D. As illustrated in FIG. 2E, spacer regions 140, 142 are formed adjacent to the gate dielectric layer 112 and the non-insulative region 102. Source/drain (SD) implants (e.g., boron implants) are then formed, as illustrated in FIG. 2F, to form the SD implant regions 222, 224, followed by a SD rapid thermal anneal (RTA) process to form the source/drain regions (e.g., semiconductor regions 104, 105), as illustrated in FIG. 2G.

Figure 3:
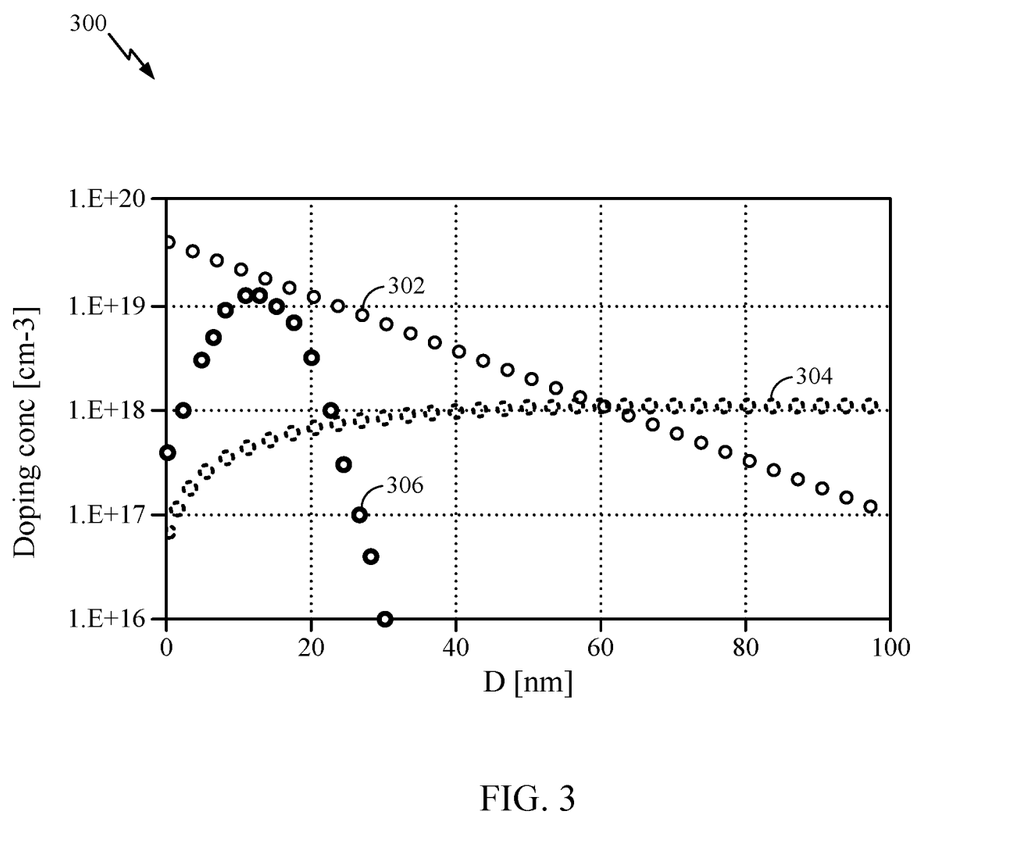
FIG. 3 is a graph illustrating doping concentrations of semiconductor regions of a transistor, in accordance with certain aspects of present disclosure.

FIG. 3 is a graph 300 illustrating the doping concentration of regions below the spacer region 142, in accordance with certain aspects of the present disclosure. The dotted line 302 illustrates the doping concentration of the semiconductor region 105 (e.g., drain region) as a function of a distance (D) from the bottom of the spacer region 142 in the direction shown by arrow 156 of FIG. 1. The dotted line 304 illustrates the doping concentration of an LDD region (e.g., LDD implant region 254) as a function of a distance (D) from the bottom of the spacer region 142 in the direction shown by arrow 156 of FIG. 1. As illustrated, the doping concentration of the semiconductor region 105 is relatively high, contributing in a major part to the high doping concentration below the spacer region 142. The dotted line 306 illustrates the doping concentration of the implant region 120 as a function of a distance (D) from the bottom of the spacer region 142 in the direction shown by arrow 156 of FIG. 1. As described herein, the implant region 120 has a doping type that is opposite the doping type of the semiconductor region 105. Thus, the implant region 120 reduces the net doping concentration below the spacer region 142.

Figure 4:
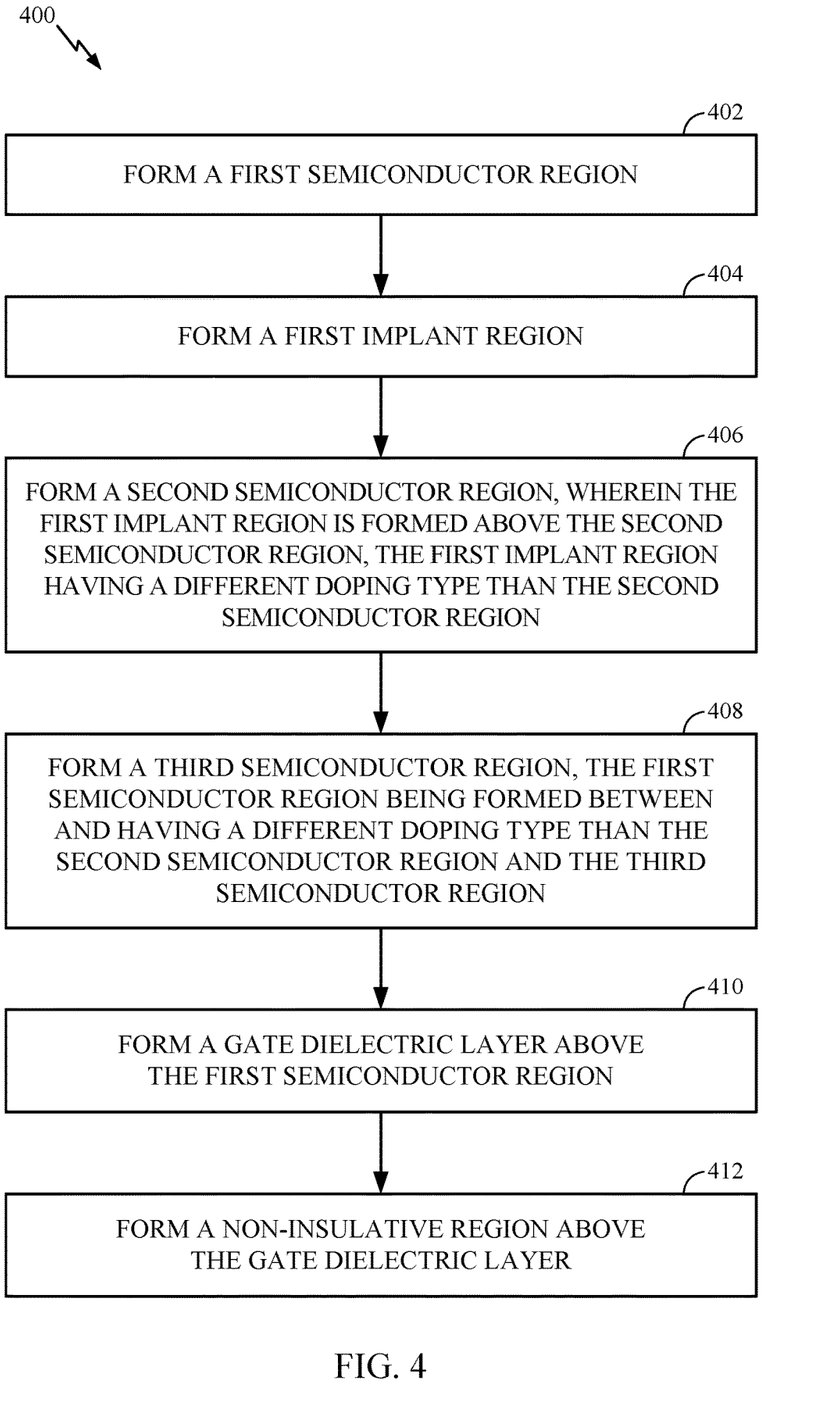
FIG. 4 is a flow diagram of example operations for fabricating a transistor, in accordance with certain aspects of the present disclosure.

FIG. 4 is a flow diagram of example operations 400 for fabricating a transistor (e.g., the transistor 100 of FIG. 1), in accordance with certain aspects of the present disclosure. The operations 400 may be performed by a semiconductor processing chamber, for example.

The operations 400 begin, at block 402, by forming a first semiconductor region (e.g., semiconductor region 106), and at block 404, forming a first implant region (e.g., implant region 120). At block 406, the operations 400 continue by forming a second semiconductor region (e.g., semiconductor region 105). In certain aspects, the first implant region is formed above the second semiconductor region, the first implant region having a different doping type than the second semiconductor region. In certain aspects, the operations 400 also includes, at block 408, forming a third semiconductor region (e.g., semiconductor region 104), the first semiconductor region being formed between and having a different doping type than the second semiconductor region and the third semiconductor region. At block 410, a gate dielectric layer (e.g., gate dielectric layer 112) is formed above the first semiconductor region, and at block 412, a non-insulative region (e.g., non-insulative region 102) is formed above the gate dielectric layer.

In certain aspects of the present disclosure, the operations 400 also include forming a second implant region (e.g., implant region 122) above the third semiconductor region, the second implant region having a different doping type than the third semiconductor region. In certain aspects, the operations 400 also include forming a first spacer region (e.g., spacer region 142) adjacent to a first lateral side of the gate dielectric layer, and forming a second spacer region (e.g., spacer region 140) adjacent to a second lateral side of the gate dielectric layer. In certain aspects, the operations 400 also include forming a first isolation region (e.g., STI region 109) and forming a second isolation region (e.g., STI region 108). In certain aspects, the second semiconductor region and the third semiconductor region may be between the first trench isolation region and the second trench isolation region. In this case, the first implant region spans from first trench isolation region to below the first spacer region (e.g., spacer region 142), and the second implant region spans from the second trench isolation region to below the second spacer region (e.g., spacer region 140).

In certain aspects, the operations 400 also include forming a first LDD region (e.g., LDD implant region 254) adjacent to the second semiconductor region, the first LDD region having the same doping type as the second semiconductor region. In certain aspects, the operations 400 also include forming a second LDD region (e.g., LDD implant region 256) adjacent to the third semiconductor region, the second LDD region having the same doping type as the third semiconductor region.

In certain aspects, the operations 400 also include forming a spacer region (e.g., spacer region 142) disposed adjacent to the gate dielectric layer and the non-insulative region, wherein the first implant region extends between the second semiconductor region and the spacer region. In certain aspects the transistor is formed as a PMOS transistor. In this case, the first implant region comprises arsenic (As). In certain aspects, the transistor is formed as an NMOS transistor. In this case, the first implant region comprises boron (B) or difluoroboron (BF2). In certain aspects, the second semiconductor region is formed as a drain of the transistor, and the third semiconductor region is formed as a source of the transistor.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." In certain aspects, means for reducing net doping concentration may comprise an LDD compensation implant region (e.g., the implant region 120 or 122).

What is claimed is:

1. A transistor comprising:
   a first semiconductor region;
   a second semiconductor region;
   a third semiconductor region, the first semiconductor region being between and having a different doping type than the second semiconductor region and the third semiconductor region;
   a gate dielectric layer disposed above the first semiconductor region;
   a non-insulative region disposed above the gate dielectric layer; and
   a first implant region disposed above the second semiconductor region, the first implant region having a different doping type than the second semiconductor region, wherein the second semiconductor region is configured as a source or a drain of the transistor.

2. The transistor of claim 1, further comprising:
   a second implant region disposed above the third semiconductor region, the second implant region having a different doping type than the third semiconductor region.

3. The transistor of claim 2, further comprising:
   a first spacer region disposed adjacent to a first lateral side of the gate dielectric layer;
   a second spacer region disposed adjacent to a second lateral side of the gate dielectric layer;
   a first trench isolation region; and
   a second trench isolation region, wherein:
      the second semiconductor region and the third semiconductor region are between the first trench isolation region and the second trench isolation region;
      the first implant region spans from the first trench isolation region to below the first spacer region; and
      the second implant region spans from the second trench isolation region to below the second spacer region.

4. The transistor of claim 1, further comprising:
   a first lightly-doped drain (LDD) region disposed adjacent to the second semiconductor region, the first LDD region having the same doping type as the second semiconductor region.

5. The transistor of claim 4, further comprising:
   a second LDD region disposed adjacent to the third semiconductor region, the second LDD region having the same doping type as the third semiconductor region.

6. The transistor of claim 1, further comprising:
   a spacer region disposed adjacent to the gate dielectric layer and the non-insulative region, wherein the first implant region extends between the second semiconductor region and the spacer region.

7. The transistor of claim 1, wherein the transistor is configured as a p-type metal-oxide-semiconductor (PMOS) transistor, and wherein the first implant region comprises arsenic (As).

8. The transistor of claim 1, wherein the transistor is configured as a n-type metal-oxide-semiconductor (NMOS) transistor, and wherein the first implant region comprises boron (B) or difluoroboron (BF2).

9. The transistor of claim 1, wherein the second semiconductor region is configured as the drain of the transistor, and wherein the third semiconductor region is configured as the source of the transistor.

10. A method for fabricating a transistor, comprising:
    forming a first semiconductor region;
    forming a second semiconductor region;
    forming a third semiconductor region, the first semiconductor region being formed between and having a different doping type than the second semiconductor region and the third semiconductor region;
    forming a gate dielectric layer above the first semiconductor region;
    forming a non-insulative region above the gate dielectric layer; and
    forming a first implant region above the second semiconductor region, the first implant region having a different doping type than the second semiconductor region, wherein the second semiconductor region is configured as a source or a drain of the transistor.

11. The method of claim 10, further comprising:
    forming a second implant region above the third semiconductor region, the second implant region having a different doping type than the third semiconductor region.

12. The method of claim 11, further comprising:
    forming a first spacer region adjacent to a first lateral side of the gate dielectric layer;
    forming a second spacer region adjacent to a second lateral side of the gate dielectric layer;
    forming a first trench isolation region; and
    forming a second trench isolation region, wherein:
       the second semiconductor region and the third semiconductor region are between the first trench isolation region and the second trench isolation region;
       the first implant region spans from the first trench isolation region to below the first spacer region; and
       the second implant region spans from the second trench isolation region to below the second spacer region.

13. The method of claim 10, further comprising:
    forming a first lightly-doped drain (LDD) region adjacent to the second semiconductor region, the first LDD region having the same doping type as the second semiconductor region.

14. The method of claim 13, further comprising:
    forming a second LDD region adjacent to the third semiconductor region, the second LDD region having the same doping type as the third semiconductor region.

15. The method of claim 10, further comprising:
    forming a spacer region disposed adjacent to the gate dielectric layer and the non-insulative region, wherein the first implant region extends between the second semiconductor region and the spacer region.

16. The method of claim 10, wherein the transistor is formed as a p-type metal-oxide-semiconductor (PMOS) transistor, and wherein the first implant region comprises arsenic (As).

17. The method of claim 10, wherein the transistor is formed as a n-type metal-oxide-semiconductor (NMOS) transistor, and wherein the first implant region comprises boron (B) or difluoroboron (BF2).

18. The method of claim 10, wherein the second semiconductor region is formed as the drain of the transistor, and wherein the third semiconductor region is formed as the source of the transistor.

19. A transistor comprising:
- a first semiconductor region;
- a second semiconductor region;
- a third semiconductor region, the first semiconductor region being between and having a different doping type than the second semiconductor region and the third semiconductor region;
- a gate dielectric layer disposed above the first semiconductor region;
- a non-insulative region disposed above the gate dielectric layer;
- a spacer disposed adjacent to the non-insulative region; and
- means for reducing a net doping concentration of a portion of the second semiconductor region, the portion of the second semiconductor region being disposed below a portion of the spacer, wherein the means for reducing the net doping concentration is disposed above the second semiconductor region, the second semiconductor region being configured as a source region or a drain region of the transistor.

* * * * *